(12) United States Patent
Van Groningen et al.

(10) Patent No.: US 6,400,158 B1
(45) Date of Patent: Jun. 4, 2002

(54) MRI APPARATUS WITH DIGITAL CONTROL AND CORRECTION OF THE GRADIENT CURRENT PULSES

(75) Inventors: Wilhelmus Daniel Hyacinthus Van Groningen; Robbert Jacobus Van Wesenbeeck, both of Eindhoven; Paulus Petrus Joannes Van Den Bosch, Nuenen, all of (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/716,906

(22) Filed: Nov. 20, 2000

(30) Foreign Application Priority Data

Nov. 19, 1999 (EP) .............................................. 99203871

(51) Int. Cl.$^7$ ................................................ G01V 3/00
(52) U.S. Cl. ....................................... 324/322; 324/318
(58) Field of Search ................................ 324/318, 322, 324/314, 300, 306, 307, 309

(56) References Cited

U.S. PATENT DOCUMENTS

| 5,227,728 A | * | 7/1993 | Kaufman et al. | 324/322 |
| 5,442,290 A | * | 8/1995 | Crooks | 324/309 |
| 6,025,720 A | * | 2/2000 | Lenz et al. | 324/322 |

FOREIGN PATENT DOCUMENTS

| DE | 19729431 A | 6/1998 | H02M/3/10 |

* cited by examiner

Primary Examiner—Louis Arana
(74) Attorney, Agent, or Firm—John Vodopia

(57) ABSTRACT

Gradient current pulses which generate pulse-shaped magnetic gradient fields in an MRI apparatus may be composed of gradient pulse samples which directly succeed one another and are generated by a power amplifier 51. The latter is controlled by an input signal 47 which assumes discrete values only. This input signal is generated by a digital PWM converter 45. Generally speaking, the discretization will introduce a difference between the discrete gradient pulse sample and the value to be discretized, but such a difference will be known. According to the invention this difference is stored until the next gradient pulse sample is formed. The value then found is corrected by means of the stored difference and the value thus calculated is discretized as described. In this way small deviations from the desired value still occur in the gradient pulse sample, but averaged over the total duration of the gradient current pulse this deviation appears to be so small that it can be ignored.

4 Claims, 3 Drawing Sheets

MRI APPARATUS WITH DIGITAL CONTROL AND CORRECTION OF THE GRADIENT CURRENT PULSES

BACKGROUND OF THE INVENTION

The invention relates to a magnetic resonance apparatus which includes a gradient device including gradient coils for generating a magnetic gradient field in an imaging volume of the apparatus by means of gradient current pulses, each of which is formed from a series of successive gradient pulse samples, and a control device which is connected to the gradient coils in order to produce the gradient pulse samples. The control device includes a converter for producing an analog signal whose value is specified by a discrete signal to be received by the converter, which analog signal is applied to a power amplifier for producing the gradient pulse samples. The control device also includes processor means for calculating a desired value of a first gradient pulse sample, a first discrete value which approximates the desired value of the first gradient pulse sample, and a desired value of a second gradient pulse sample which succeeds the first gradient pulse sample and is associated with the same gradient current pulse, a second discrete value which approximates the desired value of the second gradient pulse sample, where the successive discrete values constitute the discrete signal to be received by the converter.

An apparatus of this kind is known from the published German patent application No. 197 29 431.

A medical MRI (Magnetic Resonance Imaging) apparatus is used to form images of an object to be examined which is situated in an imaging volume of the apparatus in which a uniform, steady field (a so-called main field) exists. A gradient field which varies (usually linearly) as a function of the location is superposed on the main field so as to indicate, in the region to be imaged, the point (x, y, z) which is to be imaged at a given instant. Each point (x, y, z) in the region to be imaged is then indicated by the instantaneous value of an x gradient field, a y gradient field and a z gradient field. The time-dependent variation of these fields is shaped as a pulse, i.e. the so-called gradient pulse which often has a trapezoidal shape and a duration of the order of magnitude of 1 ms. Said gradient fields are generated by pairs of coils (i.e. one pair for each of the x, y and z co-ordinates), each of which is traversed by associated gradient current pulses.

In the case of digital control of the formation of the gradient pulses in an MRI apparatus, the gradient current pulses generating the pulse-shaped gradient fields are composed of directly successive sub-pulses which will be referred to hereinafter as gradient pulse samples and are produced by a power amplifier which may be constructed as a so-called switched mode H bridge. Such a power amplifier includes four output transistors in a H configuration, each transistor being controlled by an input signal which assumes discrete values only. Such an input signal can be produced by a converter, for example a pulse width converter (PWM converter) which is connected to the output of a processor. The processor in the MRI apparatus which is known from the cited German patent application calculates the desired value of a gradient pulse sample; this desired value is subsequently approximated as well as possible by a discrete value. This process takes place for all successive gradient pulse samples which together constitute the gradient current pulse to be generated.

Such a digital formation of the gradient pulse samples involves the problem that the time resolution required for the processor must be so high that state of the art processors cannot satisfy these requirements or only hardly so; this will be demonstrated by the following numerical example. The maximum clock frequency at which the digital formation of the gradient pulse samples takes place is of the order of magnitude of 25 kHz; this value cannot be chosen to be higher, because the power transistors used (IGBTs) cannot follow a higher switching speed. Thus, this results in a period of at least 40 $\mu$s for a gradient pulse sample from the PWM converter. The time integral of the gradient pulse is of importance for the formation of gradient pulses, i.e. the deviation therein ("the surface error") may amount to no more than 10 $\mu$As; the surface of such a pulse is typically 10 As, meaning a resolution of $10^{-6}$. (The desired resolution in the current through the gradient coils is 1 mA for a maximum current of 1000 A, which also means a resolution of $10^{-6}$.) In order to achieve this resolution with a time discrete composition of the gradient pulse sample, therefore, a smallest unit of time of $10^{-6} \times 40$ $\mu$s=$40.10^{-12}$ s is required. The latter time resolution corresponds to a minimum clock frequency of the processor of 25 GHz; this frequency cannot be achieved by commercially available standard processors.

The digital control of the known MRI apparatus aims to solve the described problem by imparting to the gradient pulse sample the shape of a PWM pulse which is formed as the sum of two PWM pulse sections, a first pulse section being formed by the 9 most significant bits of the 22 bits constituting the digital gradient pulse sample. These 9 most significant bits are applied as one data word to the pulse shaper which forms therefrom a pulse having a duration which corresponds to the value of said 9-bit data word. The 13 remaining, least significant bits also form a data word wherefrom the second pulse section is formed. The second pulse section is added in time to the first pulse section. The PWM pulse thus composed constitutes a gradient pulse sample having the desired exact pulse duration.

This known method of forming a gradient pulse sample having the desired exact pulse duration has the drawback that it requires the use of very accurate components. This is because the time accuracy of the first pulse section may not be less than the smallest time unit of the second pulse section, being of the order of magnitude of $40.10^{-12}$ s in the above numerical example. It will be very difficult or even impossible to satisfy this requirement in practice.

SUMMARY OF THE INVENTION

It is an object of the invention to provide an MRI apparatus of the kind set forth in which gradient current pulses can be generated with the desired accuracy. To this end, the MRI apparatus according to the invention is characterized in that the processor means are also arranged to calculate the difference between the desired value of the first pulse sample and the first discrete value and to store said difference, and to correct the value of the second gradient pulse sample by means of said difference during its calculation.

For the discretization of the desired value of a gradient pulse sample a number of bits is accepted which is (much) smaller than the number corresponding to the desired resolution. As a result, generally speaking, the value of the discretized gradient pulse sample will deviate from the desired value, but this deviation is known, because both the desired value and the discretized value are known. This known deviation (the difference) is saved until the next gradient pulse sample is to be formed. A desired value is then calculated again. The difference calculated during the formation of the preceding gradient pulse sample is then added to or subtracted from the value then found (depending on the sign of the difference) and the value thus calculated is subsequently discretized again as described above. Small deviations from the desired value thus occur for each gradient pulse sample, but it has been found that the average value of this deviation over the duration of the entire gradient current pulse is so small that it can be ignored.

The converter for producing said analog signal in a preferred embodiment of the invention is formed by a digitally controlled pulse width modulated converter. In combination with an MRI apparatus this embodiment offers the advantage that signals originating from such a converter in principle need be filtered merely by a simple low-pass filter so as to remove the RF part of the spectrum and hence obtain the desired gradient pulse samples.

In a further embodiment of the invention the digitally controlled pulse width modulated converter is formed by a suitably programmed microprocessor. This embodiment offers the advantage that the parameters of the PWM function can be readily changed by way of a usually minor modification of the program of the microprocessor. Such a change concerns, for example a change of the pulse period or the fineness of the time raster, i.e. the magnitude in time of the discretization steps of the converter.

BRIEF DESCRIPTION OF THE DRAWINGS

The invention will be described in detail hereinafter with reference to the Figures. Therein.

DESCRIPTION OF THE PREFERRED EMBODIMENTS

Figure 1:
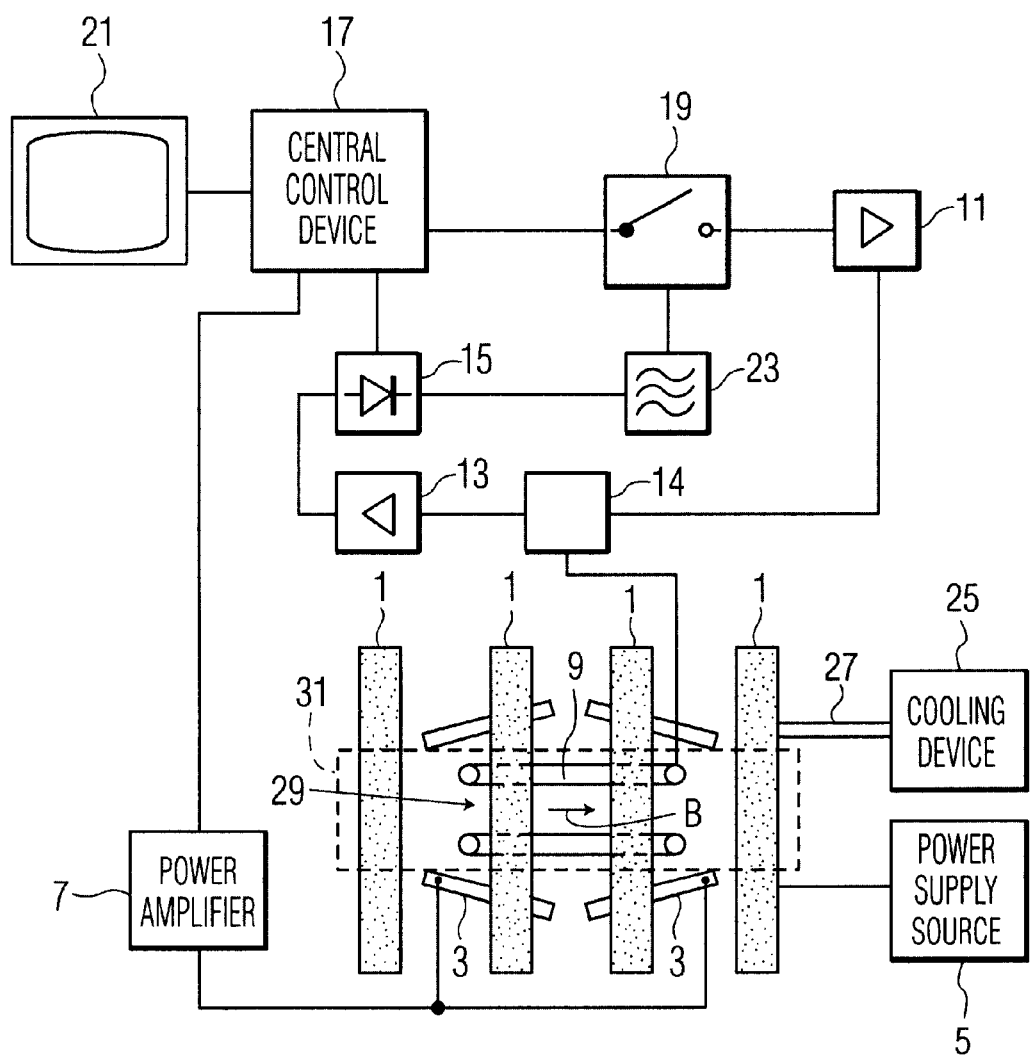
FIG. 1 shows diagrammatically the general construction of a customary magnetic resonance apparatus.

The magnetic resonance apparatus which is diagrammatically shown in FIG. 1 includes a first magnet system 1 for generating a steady magnetic field B, a second magnet system 3 (the gradient coil system) for generating magnetic gradient fields, a power amplifier 7 for the gradient coil system 3, and a power supply source 5 for the first magnet system 1. An RF coil 9 serves to generate an RF magnetic alternating field; to this end, it is connected to an RF transmitter device which includes an RF source 11. The RF coil 9 can also be used for the detection of spin resonance signals generated by the RF transmission field in an object to be examined (not shown); to this end, the RF coil is connected to an RF receiving device which includes a signal amplifier 13. The output of the signal amplifier 13 is connected to a detector circuit 15 which is connected to a central control device 17. The central control device 17 also controls a modulator 19 for the RF source 11, the power amplifier 7 and a monitor 21 for image display. An RF oscillator 23 controls the modulator 19 as well as the detector 15 which processes measuring signals. A cooling device 25 with cooling ducts 27 is provided for cooling the magnet coils of the first magnet system 1. The RF coil 9, being arranged within the magnet systems 1 and 3, encloses a measuring space 29 which is large enough to accommodate a patient, or a part of a patient, to be examined in an apparatus for medical diagnostic measurements, for example the head and the neck. Thus, a steady magnetic field B, gradient fields for selecting object slices, and a spatially uniform RF alternating field can be generated in the measuring space 29. The RF coil 9 can combine the functions of transmission coil and measuring coil; in that case a separating circuit 14 is provided so as to separate the forward and the return signal traffic. It is alternatively possible to use different coils for the two functions, for example surface coils then acting as measuring coils. If desired, the coil 9 may be enclosed by an RF field shielding Faraday cage 31.

Figure 2:
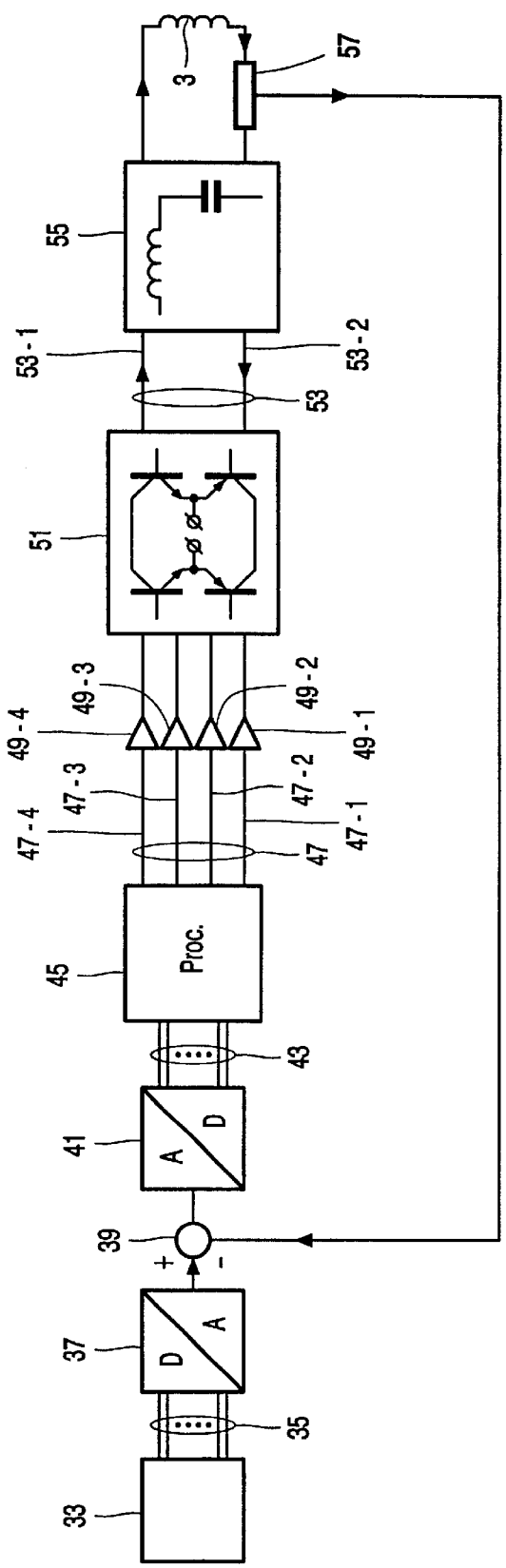
FIG. 2 shows a diagram of a control device for producing gradient pulse samples.

FIG. 2 is a more detailed representation of a control device for producing gradient current pulses which are formed from gradient pulse samples and generate the magnetic gradient field. The user of the MRI apparatus according to the invention selects a given imaging mode; this selection is received by a computer 33. Depending on the selected imaging mode, the computer determines the shape and other parameters of the gradient current pulses associated with the relevant imaging mode. An example in this respect is a gradient current pulse having a trapezoidal shape and parameters such as a pulse duration of 1 ms, a rise time and a fall time of 0.1 ms each, and an amplitude of 600 V. On the basis of this data the computer calculates the number and the magnitude of the associated gradient pulse samples. FIG. 2 shows the computer as a single function block, but in a practical application the described function can be carried out by a combination of the central control device 17 (FIG. 1) and a special processor; the central control device then outputs only a code concerning the waveform and the value of said parameters whereas the special processor calculates the magnitude of the associated gradient pulse samples.

The gradient pulse samples thus determined are transferred in digital form, via a multiple data line 35, to an analog-to-digital converter 37 which produces an output signal whose analog value is equal to the digital input value. Said analog output signal is applied to the positive input of a difference forming device 39. A feedback signal which is a measure of the instantaneous value of the current through the gradient coil 3 is applied to the negative input of the difference forming device 39. The difference signal constituting the output signal of the difference forming device 39 is applied to an analog-to-digital converter 41 which applies said difference signal in digital form, via a multiple data line 43, to a processor 45 which acts as a pulse width modulated converter (PWM converter). As is known, such PWM converters produce a pulse-shaped signal having a fixed period T and a pulse duration which is proportional to the input signal applied to the PWM converter.

The output signal of the processor 45 is applied to the control inputs of a power amplifier 51. The power amplifier is constructed as a so-called H bridge, i.e. this amplifier can output a current in two directions. At each end of the load of this amplifier a respective output transistor is provided for each of the current directions, so that this amplifier includes a total of four output transistors in a H configuration. Each of these transistors is controlled by a respective output conductor 47-1, 47-2, 47-3 or 47-4 of the output 47 of the processor 45. Each output conductor 47-i is provided with an associated buffer amplifier 49-i. The output 53, formed by the two output conductors 53-1 and 53-2, carries a current whose variation in time is specified by the voltage on the output 47 of the processor 45. This means that, when one pair of output transistors of the power amplifier 51 is driven to the conductive state, the other pair is not conductive and vice versa, depending on the presence or absence of a pulse on the corresponding output conductor of the output 47.

The current supplied by the power amplifier 51 traverses a filter unit 55 which suppresses frequencies in the RF range and higher. Each of the two output conductors 53-1 and 53-2 is provided with its own low-pass filter; the simplest form of this filter consists of an inductance in series with the conductor and a capacitance connected to ground at the downstream side of the inductance, so that the filter unit 55 consists of two low-pass filters. The current thus filtered by the filter unit 55 constitutes the gradient current pulses desired by the user and associated with the imaging mode desired by the user. These gradient current pulses are formed from a series of successive gradient pulse samples which constitute a representation of the PWM signals applied to the input of the amplifier 51. As is known, the magnitude of these gradient pulse samples in PWM converters is proportional to the low-frequency signal contents of the PWM signals applied to the inputs of the amplifier 51. (The RF signal contents have been removed by the filter unit 55.) The current through the gradient coil 3 also traverses a current sensor 57 which produces a signal which is a measure of the value of the current passing therethrough. This signal is fed back to the negative input of the difference forming device 39 so as to be subtracted from the analog signal representing the magnitude of the calculated gradient pulse sample.

Figure 3:
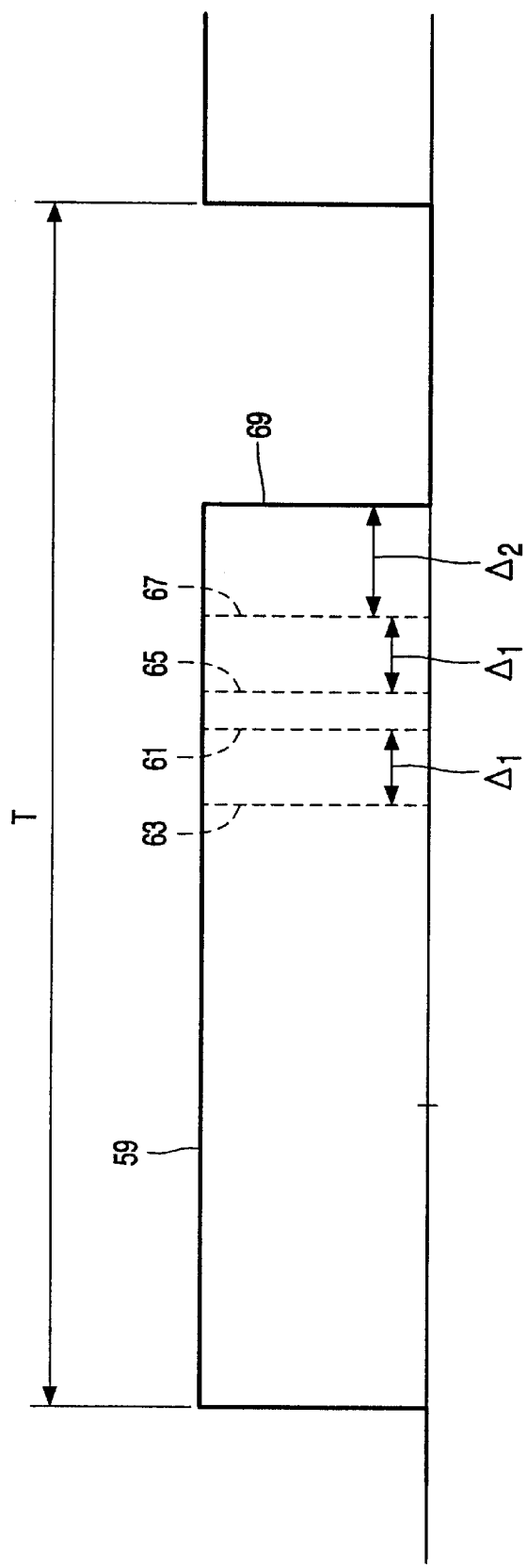
FIG. 3 shows graphically the variation of an output signal of a PWM converter in the control device shown in FIG. 2.

In order to illustrate the invention FIG. 3 shows graphically a number of signals, imaginary or not, as they may occur on any one of the output conductors of the output 47. Because the pulses are formed by a digital processor according to the PWM mode, the pulse length of the PWM pulse 59 produced on the relevant output by the processor 45 is discretized in time. The period of this pulse-shaped signal is denoted by the letter T. For the sake of clarity it is assumed that the pulse duration can assume only five values (0, 0.25 T, 0.5 T, 0.75 T and T), even though this number will be much larger in a practical embodiment, for example $2^{10}=1024$.

One of the processors included in this system, either the computer 33 or the processor 45 or any other processor, calculates the desired value of a gradient pulse sample to be formed by the system shown in FIG. 2, for example, the ih gradient pulse sample. This desired value corresponds to a pulse duration which is denoted by the dashed line 61 in FIG. 3, for example 0.56 T. Because this value belongs to the possibilities of the processor 45, the program used so as to produce the PWM pulses in this processor will round this desired value to the discrete value best approximating the desired value of the gradient pulse sample, being 0.5 T. The difference between the latter value and the desired value, therefore, amounts to 0.06 T; this is denoted by the reference $\Delta^1$ in FIG. 3. This difference is stored in a memory of the processor 45. On the relevant output of the processor 45 there is now produced a pulse having a pulse duration amounting to 0.5 T as indicated by the dashed line 63.

Subsequently, the desired value of the next gradient pulse sample to be formed is calculated, that is, the $(i+1)^{th}$ gradient pulse sample. In FIG. 3 this desired value corresponds to a pulse duration as denoted by the dashed line 65, for example 0.61 T. If this value were to be rounded to the discrete value best approximating this desired value, a pulse duration of 0.5 T would be obtained again as denoted by the dashed line 63. In conformity with the invention, however, the amount not taken into account for the previous gradient pulse sample (i.e. the stored difference amounting to 0.06 T) is added to the pulse duration of the gradient pulse sample to be formed in the present period. Consequently, the desired value of the $(i+1)^{th}$ gradient pulse sample reaches the value 0.61 T+0.06 T=0.67 T as denoted by the dashed line 67 in FIG. 3. This value is rounded to the discrete value most closely approximating this desired value, being a pulse duration of 0.75 T as denoted by the solid line 69. The deviation (denoted by the reference $\Delta_2$ in the Figure) caused by this discretization is stored again in the memory of the processor 45 so as to be used to correct the desired value of the $(i+2)^{th}$ gradient pulse sample. Because an excessively large pulse duration has been formed during the discretization of the $(i+1)^{th}$ gradient pulse sample, the value now stored will have to be subtracted from the calculated desired value of the $(i+2)^{th}$ gradient pulse sample.

The repetition of the described process will continue even when the desired current in the current pulse has become zero. The section of the control circuit which is situated between the difference forming device 39 and the current sensor 57 (FIG. 2) controls the output current in such a manner that the amplitude of the error signal at the difference forming device 39 is minimized. Should a situation involving a minimum amplitude of the error signal occur for a desired value of the gradient pulse sample (corresponding to 0.56 T in the above example) between two discretized values (corresponding to 0.5 T and 0.75 T in the above example), the processor 45 will, in case no correction factor has remained from the preceding gradient pulse sample, round this value to 0.5 T, thus giving rise to an error corresponding to 0.06 T in the gradient pulse sample. Because it has been assumed that the processor 45 is only capable of realizing a gradient pulse sample corresponding to a duty cycle of 0.50 T or 0.75 T, there will be a current error in practically all cases. In case a correction factor has remained from the preceding gradient pulse sample, the gradient pulse sample will be in the state 0.5 T or 0.75 T, so that the mean value of the gradient pulse samples discretized by the PWM converter corresponds to the desired, non-discretized value, so 0.56 T in the present example.

Due to a variety of integrating effects in the control loop (notably due to the inductive nature of the gradient coil), this loop exhibits a time constant which is (much) larger than the period duration of the PWM converter. Consequently, the control loop will not respond to the discrete values but to the mean value of the discretized gradient pulse samples. This prevents the occurrence of a considerable, time integrated deviation in the gradient current which would seriously disturb the process of position indication during MRI imaging (the "surface error").

The above procedure will be illustrated on the basis of the following Table 1. This Table shows the process during 15 periods of the PWM converter, the first column stating the sequence number (No.) of the period. The subsequent columns state the values in the associated duty cycle of the PWM converter. The second column states the desired value $U_{des}$ of the relevant gradient pulse sample; the third column states the desired value of the relevant gradient pulse sample, provided with the correction originating from the preceding period ($U'_{des}$); the fourth column states the associated discrete value ($U_{disc}$) of the relevant gradient pulse sample, and the fifth column states the difference between the value in the third column and that in the fourth column, said difference thus constituting the correction ($U_{corr}$) to be applied in the next period.

TABLE 1

| No. | $U_{des}$ | $U'_{des}$ | $U_{disc}$ | $U_{corr}$ |
|---|---|---|---|---|
| 1 | 0.56 | 0.56 | 0.50 | 0,00 |
| 2 | 0.56 | 0.56 | 0.50 | 0.06 |
| 3 | 0.56 | 0.62 | 0.75 | 0.12 |
| 4 | 0.56 | 0.68 | 0.50 | −0.07 |
| 5 | 0.56 | 0.49 | 0.50 | 0.01 |

TABLE 1-continued

| No. | $U_{des}$ | $U'_{des}$ | $U_{disc}$ | $U_{corr}$ |
|---|---|---|---|---|
| 6 | 0.56 | 0.55 | 0.50 | 0.05 |
| 7 | 0.56 | 0.61 | 0.75 | 0.11 |
| 8 | 0.56 | 0.67 | 0.50 | −0.08 |
| 9 | 0.56 | 0.48 | 0.50 | −0.02 |
| 10 | 0.56 | 0.54 | 0.50 | 0.04 |
| 11 | 0.56 | 0.60 | 0.75 | 0.10 |
| 12 | 0.56 | 0.66 | 0.50 | −0.09 |
| 13 | 0.56 | 0.47 | 0.50 | −0.03 |
| 14 | 0.56 | 0.53 | 0.50 | 0.03 |
| 15 | 0.56 | 0.59 | 0.75 | 0.09 |

The numbers stated in the above Table 1 show that for a constant desired value $U_{des}$ of the relevant gradient pulse sample the mean value of the discrete values ($U_{disc}$) of the gradient pulse sample arbitrarily closely approximates this desired value.

What is claimed is:

1. A magnetic resonance apparatus which includes a gradient device, comprising:
    gradient coils for generating a magnetic gradient field in an imaging volume of the apparatus by means of gradient current pulses, each of which is formed from a series of successive gradient pulse samples, and
    a control device which is connected to the gradient coils in order to produce the gradient pulse samples, the control device comprising:
        a converter for producing an analog signal whose value is specified by a discrete signal to be received by the converter, which analog signal is applied to a power amplifier for producing the gradient pulse samples, and
        processor means for calculating:
            a desired value of a first gradient pulse sample,
            a first discrete value which approximates the desired value of the first gradient pulse sample,
            a desired value of a second gradient pulse sample which succeeds the first gradient pulse sample and is associated with the same gradient current pulse,
            a second discrete value which approximates the desired value of the second gradient pulse sample,
            a number of successive discrete values constituting the discrete signal to be received by the converter,
            a difference between the desired value of the first gradient pulse sample and the discrete value, where said difference is stored, and
            a correction value of the second gradient pulse sample by means of said difference during calculation of said difference.

2. A magnetic resonance apparatus as claimed in claim 1, wherein the converter for producing said analog signal is formed by a digitally controlled pulse width modulated converter.

3. A magnetic resonance apparatus as claimed in claim 2, wherein the digitally controlled pulse width modulated converter is formed by a suitably programmed microprocessor.

4. A control device for producing gradient pulse samples in order to form gradient current pulses in a magnetic resonance apparatus as defined in claim 1.

* * * * *